(12) United States Patent
Aoki (10) Patent No.: US 9,170,504 B2
(45) Date of Patent: Oct. 27, 2015

(54) MOVABLE BODY APPARATUS, EXPOSURE APPARATUS AND DEVICE MANUFACTURING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/155,914

(22) Filed: Jan. 15, 2014

(65) Prior Publication Data

US 2014/0125961 A1    May 8, 2014

Related U.S. Application Data

(62) Division of application No. 12/714,733, filed on Mar. 1, 2010, now Pat. No. 8,659,746.

(60) Provisional application No. 61/157,415, filed on Mar. 4, 2009.

(51) Int. Cl.
  *G03B 27/58* (2006.01)
  *G03B 27/42* (2006.01)
  *G03F 7/20* (2006.01)

(52) U.S. Cl.
  CPC ........ *G03F 7/70716* (2013.01); *G03F 7/70758* (2013.01); *G03F 7/70791* (2013.01)

(58) Field of Classification Search
  CPC .................. G03F 7/70716; G03F 7/70791
  USPC .......... 355/53, 72–76; 310/10, 12; 378/34, 35
  See application file for complete search history.

(56) References Cited

U.S. PATENT DOCUMENTS

| 5,684,856 A | 11/1997 | Itoh et al. |
| 6,408,045 B1 | 6/2002 | Matsui et al. |
| 6,552,775 B1 | 4/2003 | Yanagihara et al. |
| 6,778,257 B2 | 8/2004 | Bleeker et al. |

(Continued)

FOREIGN PATENT DOCUMENTS

| JP | H05329727 A | 12/1993 |
| JP | 2002208562 A | 7/2002 |

(Continued)

OTHER PUBLICATIONS

Mar. 25, 2013 Office Action issued in U.S. Appl. No. 12/714,733.

(Continued)

*Primary Examiner* — Hung Henry Nguyen
(74) *Attorney, Agent, or Firm* — Oliff PLC (57) ABSTRACT

An exposure apparatus has a substrate holding member, a first supporting member, a second supporting member, and a driving system. The first supporting member supports the substrate holding member from below. The second supporting member supports the first supporting member from below such that the first supporting member and the second supporting member are capable of moving relative to each other. The driving system moves the substrate holding member, the first supporting member and the second supporting member. The driving system includes a first driving device and a second driving device, the first driving device moving the substrate holding member and the first supporting member in a direction along a predetermined axis, and the second driving device moving the second supporting member in the direction along the predetermined axis.

16 Claims, 6 Drawing Sheets

(56) References Cited

U.S. PATENT DOCUMENTS

| | | | |
|---|---|---|---|
| 7,221,433 B2 * | 5/2007 | Binnard | 355/72 |
| 7,271,879 B2 * | 9/2007 | Lim et al. | 355/75 |
| 7,795,833 B2 * | 9/2010 | Sekiguchi | 318/575 |
| 2002/0075467 A1 | 6/2002 | Tanaka et al. | |
| 2005/0259234 A1 | 11/2005 | Hirukawa et al. | |
| 2008/0030702 A1 | 2/2008 | Kawamura | |
| 2008/0192226 A1 | 8/2008 | Shibazaki | |
| 2010/0018950 A1 | 1/2010 | Aoki et al. | |
| 2010/0030384 A1 | 2/2010 | Kraner et al. | |

FOREIGN PATENT DOCUMENTS

| | | |
|---|---|---|
| JP | A-2004-260116 | 9/2004 |
| JP | A-2006-012911 | 1/2006 |
| JP | A-2006-086442 | 3/2006 |
| WO | WO 01/35168 A1 | 5/2001 |
| WO | WO 2008/129762 A | 10/2008 |

OTHER PUBLICATIONS

Oct. 11, 2013 Notice of Allowance issued in U.S. Appl. No. 12/714,733.

International Search Report issued in corresponding International Application No. PCT/JP2010/053715, mailed Jun. 9, 2010.

Written Opinion of the International Searching Authority issued in corresponding International Application No. PCT/JP2010/053715, mailed Jun. 9, 2010.

Oct. 16, 2014 Office Action issued in Japanese Application No. 2014-011949.

Oct. 23, 2014 Office Action issued in Taiwanese Application No. 099106064.

Nov. 28, 2013 Office Action issued in Japanese Application No. 2010-045208 (with English Translation).

May 25, 2015 Office Action issued in Japanese Patent Application No. 2014-011949.

\* cited by examiner

MOVABLE BODY APPARATUS, EXPOSURE APPARATUS AND DEVICE MANUFACTURING METHOD

CROSS-REFERENCE TO RELATED APPLICATIONS

This application is a division of U.S. application Ser. No. 12/714,733, filed Mar. 1, 2010 (which is now U.S. Pat. No. 8,659,746, issued Feb. 25, 2014), and claims priority to U.S. Provisional Application No. 61/157,415, filed on Mar. 4, 2009. The prior applications, including the specifications, drawings and abstracts are incorporated herein by reference in their entirety.

BACKGROUND OF THE INVENTION

1. Field of the Invention

The present invention relates to movable body apparatuses, exposure apparatuses and device manufacturing methods, and more particularly to a movable body apparatus equipped with a movable body that moves along a predetermined two-dimensional plane, an exposure apparatus equipped with the movable body apparatus, and a device manufacturing method using the exposure apparatus.

2. Description of the Background Art

Conventionally, in a lithography process for manufacturing electron devices (microdevices) such as liquid crystal display elements or semiconductor devices (integrated circuits or the like), an exposure apparatus such as a projection exposure apparatus by a step-and-repeat method (a so-called stepper), or a projection exposure apparatus by a step-and-scan method (a so-called scanning stepper, which is also called a scanner) is mainly used.

In recent years, however, a substrate subject to exposure in an exposure apparatus (especially, a glass plate subject to exposure in a liquid crystal exposure apparatus) has tended to increasingly grow in size, and in the exposure apparatus as well, a size of a substrate table that holds the substrate has increased, and position control of the substrate becomes difficult owing to the weight increase accompanying the size increase. As the solution to solve such a problem, an exposure apparatus has been developed in which the empty-weight of a substrate table that holds a substrate is supported by an empty-weight cancelling device (empty-weight canceller) made up of a columnar member (e.g. refer to PCT International Publication No. 2008/129762).

In this type of exposure apparatus, the empty-weight cancelling device moves integrally with the substrate table along the upper surface (guide surface) of a surface plate that is a plate-shaped member formed by, for example, stone. Further, since the guide surface of the surface plate is used to guide the substrate table along a two-dimensional plane with high accuracy, the guide surface is finished so as to have the very high flatness degree.

However, in order to drive a substrate, which has grown in size, with a long stroke, it is necessary to increase the size of the surface plate having the guide surface used when the empty-weight cancelling device moves, and therefore, the machining of the surface plate becomes difficult. Further, when the surface plate grows in size, it becomes difficult to carry (e.g. transport by a vehicle) the surface plate to a place where an exposure apparatus is installed (e.g. a manufacturing plant of liquid crystal panels).

SUMMARY OF THE INVENTION

According to a first aspect of the present invention, there is provided a movable body apparatus, comprising: a plurality of surface plates each of which has a guide surface parallel to a two-dimensional plane that includes a first axis and a second axis orthogonal to each other, and which are placed at a predetermined distance in a direction parallel to the first axis; a first movable body that is movable along a plane parallel to the two-dimensional plane, above the plurality of surface plates; a first support member that supports an empty weight of the first movable body and moves within a plane parallel to the two-dimensional plane above the plurality of surface plates, together with the first movable body; a second support member that supports the first support member such that the first support member is relatively movable in the direction parallel to the first axis; and a plurality of third support members placed so as to correspond to the plurality of surface plates, respectively, which support the second support member in a state where the second support member is bridged over the plurality of surface plates.

With this apparatus, when the first support member, which moves together with the first movable body above a plurality of the surface plates that are placed at a predetermined distance in a direction parallel to the first axis, moves in the direction parallel to the first axis, the first support member moves on the second support member that is supported by a plurality of the third support members placed so as to correspond to a plurality of the surface plates respectively. Since the second support member is placed so as to be bridged over (placed astride) a plurality of the surface places via a plurality of the third support members, even in the case when the first support member moves from above one of the adjacent surface plates to above the other, the first support member can be guided along the two-dimensional plane with high accuracy.

According to a second aspect of the present invention, there is provided a first exposure apparatus to expose an object by irradiating the object with an energy beam, the apparatus comprising: the movable body apparatus of the present invention in which the object is held on the first movable body; and a patterning device that irradiates the object mounted on the first movable body with the energy beam.

According to a third aspect of the present invention, there is provided a second exposure apparatus to expose an object by irradiating the object with an energy beam, the apparatus comprising: a plurality of surface plates each of which has a guide surface parallel to a two-dimensional plane that includes a first axis and a second axis orthogonal to each other, and which are placed at a predetermined distance in a direction parallel to the first axis; a first stage that is movable, while holding the object, along a plane parallel to the two-dimensional plane, above the plurality of surface plates; an empty-weight cancelling member that supports an empty weight of the first stage and moves within a plane parallel to the two-dimensional plane above the plurality of surface plates, together with the first stage; a plate member that supports the empty-weight cancelling member such that the empty-weight cancelling member is relatively movable in the direction parallel to the first axis; a plurality of support members placed so as to correspond to the plurality of surface plates, respectively, which support the plate member in a state where the plate member is bridged over the plurality of surface plates; and a patterning device that irradiates the object held on the first stage with the energy beam.

With this apparatus, even in the case when the empty-weight cancelling member moves from above one of the adjacent surface plates to above the other, the empty-weight cancelling member can be guided with high accuracy along the two-dimensional plane. Accordingly, during exposure, the empty weight of the first stage that holds an object can be supported by the empty-weight cancelling member, and the empty-weight cancelling member can be guided along the two-dimensional plane, which makes it possible to drive the object held on the first stage in a stable manner, and thereby exposure with high precision can be performed.

According to a fourth aspect of the present invention, there is provided a device manufacturing method, comprising: exposing a substrate using one of the first and second exposure apparatuses of the present invention; and developing the substrate that has been exposed.

In this case, there is provided a manufacturing method of manufacturing a flat-panel display as a device by using, as the substrate, a substrate for a flat-panel display. The substrate for a flat-panel display includes a film-like member or the like, besides a glass substrate or the like.

BRIEF DESCRIPTION OF THE DRAWINGS

In the accompanying drawings.

DESCRIPTION OF THE EMBODIMENTS

An embodiment of the present invention is described below, with reference to FIGS. 1 to 6C.

Figure 1:
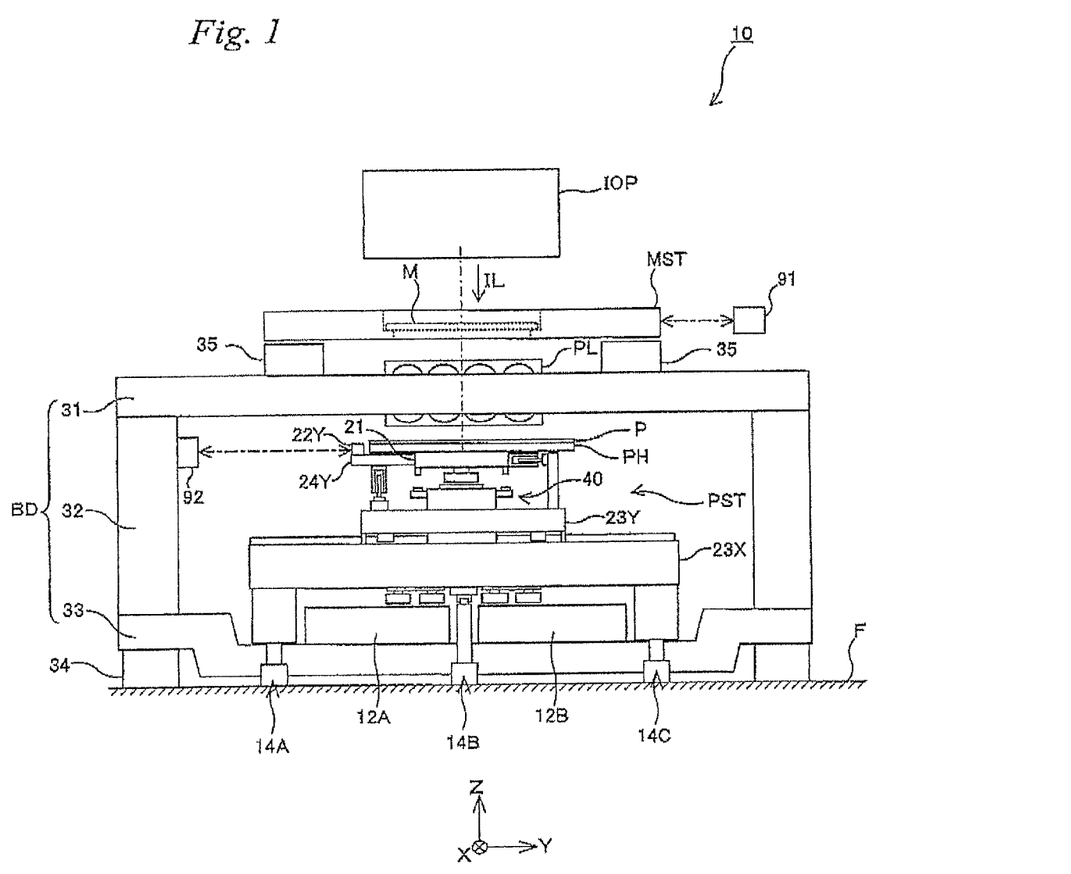
FIG. 1 is a view showing a schematic configuration of a liquid crystal exposure apparatus of an embodiment.

FIG. 1 shows a schematic configuration of a liquid crystal exposure apparatus 10 related to the embodiment. Liquid crystal exposure apparatus 10 is a projection exposure apparatus by a step-and-scan method, i.e., a so-called scanner.

As shown in FIG. 1, liquid crystal exposure apparatus 10 includes an illumination system IOP, a mask stage MST that holds a mask M, a projection optical system PL, a body BD on which mask stage MST, projection optical system PL and the like are mounted, a substrate stage PST that holds a substrate P such that substrate P is movable along an XY plane, and their control system and the like. In the description below, the explanation is given assuming that a direction in which mask M and substrate P are scanned relative to projection optical system PL, respectively, during exposure is an X-axis direction, a direction orthogonal to the X-axis direction within a horizontal plane is a Y-axis direction, and a direction orthogonal to the X-axis and Y-axis directions is a Z-axis direction, and rotational (tilt) directions around the X-axis, Y-axis and Z-axis are θx, θy and θz directions, respectively.

Illumination system IOP is configured similar to the illumination system that is disclosed in, for example, U.S. Pat. No. 6,552,775 and the like. More specifically, illumination system IOP irradiates mask M with a light emitted from a mercury lamp (not illustrated), as an illumination light for exposure (illumination light) IL, via optical elements such as a reflection mirror, a dichroic mirror, a shutter, a wavelength selecting filter and various types of lenses, which are not illustrated. As illumination light IL, for example, a light such as an i-line (with a wavelength of 365 nm), a g-line (with a wavelength of 436 nm) or an h-line (with a wavelength of 405 nm) (or a synthetic light of the i-line, the g-line and the h-line described above) is used. Further, the wavelength of illumination light IL can be appropriately switched by the wavelength selecting filter according to the required resolution.

On mask stage MST, mask M having a pattern surface (the lower surface in FIG. 1) on which a circuit pattern and the like are formed is fixed by, for example, vacuum suction. Mask stage MST is supported in a noncontact manner via, for example, air pads that are not illustrated, above a pair of mask stage guides 35 with the X-axis direction serving as their longitudinal directions that are integrally fixed to the upper surface of a barrel surface plate 31 that is a part of body BD to be described later on. Mask stage MST is driven in a scanning direction (the X-axis direction) with a predetermined stroke and also is finely driven in the Y-axis direction and the θz direction, above a pair of mask stage guides 35, by a mask stage driving system (not illustrated) that includes, for example, a liner motor.

Positional information (including rotational information in the θz direction) of mask stage MST within the XY plane is constantly detected at a resolution of, for example, around 0.5 to 1 nm with a mask laser interferometer (hereinafter, referred to as a "mask interferometer") 91, via a reflection surface fixed (or formed) on mask stage MST. The measurement values of mask interferometer 91 are sent to a controller that is not illustrated, and the controller controls the position (and the speed) of mask stage MST in the X-axis direction, the Y-axis direction and the θz direction via the mask stage driving system, based on the measurement values of mask interferometer 91.

Projection optical system PL is supported below mask stage MST in FIG. 1, by barrel surface plate 31. Projection optical system PL in the embodiment has a configuration similar to the projection optical system disclosed in, for example, U.S. Pat. No. 6,552,775. More specifically, projection optical system PL includes a plurality of projection optical systems (multi-lens projection optical systems) whose projection areas, where a pattern image of mask M is projected, are placed in a zigzag shape, and functions equivalently to a projection optical system that has a single image field with a rectangular shape whose longitudinal direction is in the Y-axis direction. In the embodiment, as each of the plurality of projection optical systems, for example, a projection optical system that is a both-side telecentric equal-magnification system that forms an erected normal image is used. In the description below, a plurality of projection areas placed in a zigzag shape of projection optical system PL are also referred to as an exposure area as a whole.

Therefore, when an illumination area on mask M is illuminated with illumination light IL from illumination system IOP, by illumination light IL that has passed through mask M whose pattern surface is placed substantially coincident with the first plane (object plane) of projection optical system PL, a projected image (partial erected image) of a circuit pattern of mask M within the illumination area is formed on an irradiation area (exposure area) of illumination light IL, which is conjugate to the illumination area, on substrate P which is placed on the second plane (image plane) side of projection optical system PL and whose surface is coated with a resist (sensitive agent), via projection optical system PL. Then, by moving mask M relative to the illumination area (illumination light IL) in the scanning direction (X-axis direction) and also moving substrate P relative to the exposure area (illumination light IL) in the scanning direction (X-axis direction) by synchronous drive of mask stage MST and substrate stage PST, scanning exposure of one shot area (divided area)

on substrate P is performed, and a pattern of mask M is transferred onto the shot area. More specifically, in the embodiment, a pattern of mask M is generated on substrate P by illumination system IOP and projection optical system PL, and the pattern is formed on substrate P by exposure of a sensitive layer (resist layer) on substrate P with illumination light IL.

Body BD includes a pair of substrate stage mountings 33 (see FIG. 3) and barrel surface plate 31 that is horizontally supported via a pair of support members 32 installed on a pair of substrate stage mountings 33, as disclosed in, for example, U.S. Patent Application Publication No. 2008/0030702 and the like. As can be seen from FIGS. 1 and 3, a pair of substrate stage mountings 33 are each made up of a member with the Y-axis direction serving as its longitudinal direction, and are placed at a predetermined distance in the X-axis direction. Each substrate stage mounting 33 has both ends in the longitudinal direction that are supported by a vibration isolating mechanism 34 installed on a floor surface F, and is separated from floor surface F in terms of vibration.

As shown in FIG. 1, substrate stage PST is equipped with a plurality (e.g. three, in the embodiment) of base frames 14A, 14B and 14C placed on floor surface F, a pair of surface plates 12A and 12B installed on a pair of substrate stage mountings 33, an X coarse movement stage 23X that is driven in the X-axis direction above the three base frames 14A to 14C, a Y coarse movement stage 23Y that is driven in the Y-axis direction on X coarse movement stage 23X and configures, together with X coarse movement stage 23X, an XY two-dimensional stage device, a fine movement stage 21 placed on the +Z side of (above) Y coarse movement stage 23Y, and an empty-weight cancelling device 40 that moves within the XY plane in conjunction with fine movement stage 21.

Figure 4:
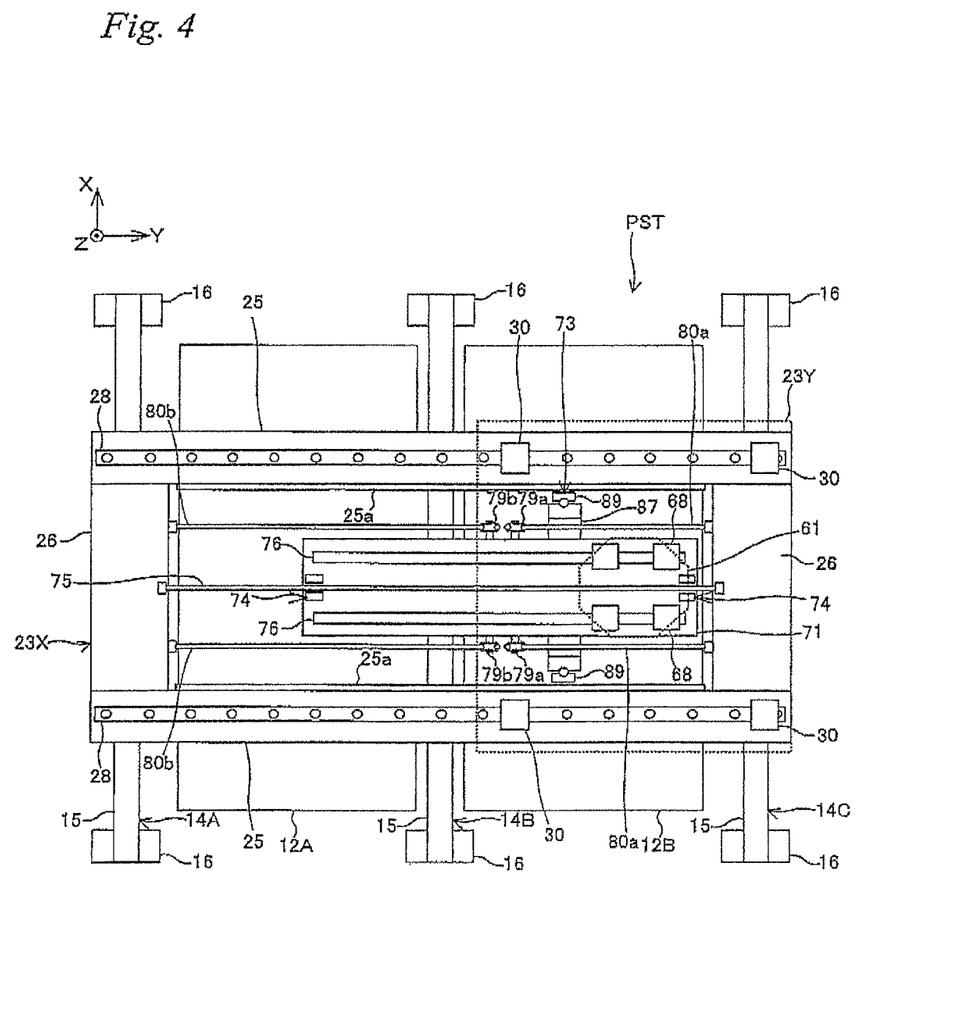
FIG. 4 is a plan view (No. 1) showing the substrate stage with partial omission.

Base frames 14A to 14C are placed at a predetermined distance in the Y-axis direction. As shown in FIG. 4, each of base frames 14A to 14C is equipped with a guide section 15 that is a stringer-like member arranged extending in the X-axis direction, and a pair of leg sections 16 that support both ends of guide section 15 on floor surface F. Each guide section 15 has a rectangular YZ section that is elongated in the Z-axis direction. Base frames 14A to 14C and substrate stage mountings 33 (see FIG. 1) are mechanically non-connected (in noncontact). Incidentally, while both ends of guide section 15 are supported by a pair of leg sections 16 in the embodiment, an intermediate portion (which may be at a plurality of positions) in the longitudinal direction of guide section 15 can also be supported by a similar leg section, along with the support of the both ends.

A pair of surface plates 12A and 12B are fixed to the upper surfaces of a pair of substrate stage mountings 33. Each of surface plates 12A and 12B is a plate-shaped member having a rectangular shape in a planar view that is formed by, for example, stone and has its longitudinal direction in the X-axis direction, and surface plates 12A and 12B are placed at a predetermined distance in the Y-axis direction. Surface plate 12A is placed between base frame 14A and base frame 14B, and surface plate 12B is placed between base frame 14B and base frame 14C. The upper surface of each of surface plates 12A and 12B is finished so as to have a very high flatness degree.

As shown in FIG. 4, X coarse movement stage 23X is equipped with Y beam members 25 that are a pair of stringer-like members placed, with the Y-axis direction serving as their longitudinal directions, at a predetermined distance in the X-axis direction and a pair of connecting members 26 that respectively connect both ends of a pair of Y beam members 25 in the longitudinal direction, and X coarse movement stage 23X is formed so as to have a rectangular frame shape in a planar view. While the lower surfaces of Y beam members 25 and the lower surfaces of connecting members 26 are placed coplanar, the upper surfaces of connecting members 26 are placed at a position lower than (on the −Z side of) the upper surfaces of Y beam members 25 (see FIG. 2).

Figure 2:
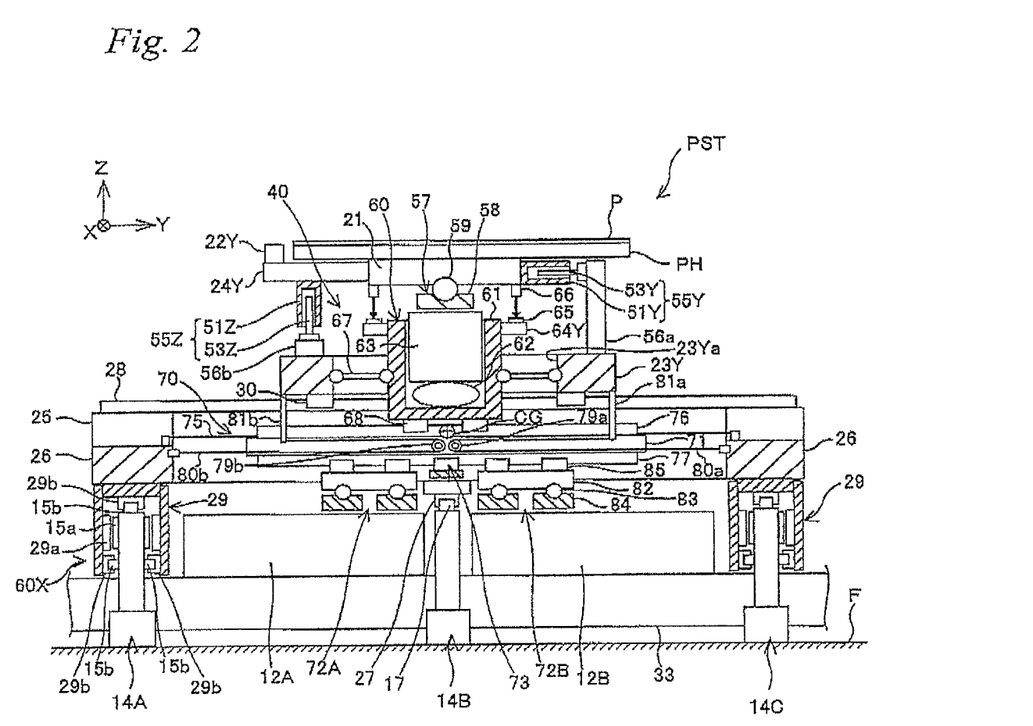
FIG. 2 is a side view (partial cross-sectional view) of a substrate stage equipped in the exposure apparatus when viewed from an X-axis direction.

As shown in FIG. 2, one of a pair of connecting members 26 (on the −Y side) is supported by base frame 14A and the other (on the +Y side) is supported by base frame 14C. On the bottom surface of each of a pair of connecting members 26, an X mover 29, which is formed so as to have an inverse U-like sectional shape, is fixed. Between a pair of opposed surfaces, which are opposed to each other, of X mover 29 fixed to connecting member 26 on the −Y side, guide section 15 (see FIG. 4) of base frame 14A is inserted. And, between a pair of opposed surfaces, which are opposed to each other, of X mover 29 fixed to connecting member 26 on the +Y side, guide section 15 (see FIG. 4) of base frame 14C is inserted. Each X mover 29 is equipped with a coil unit 29a, which includes a plurality of coils, on a pair of opposed surfaces. Meanwhile, on both side surfaces of each guide section 15, a magnetic unit 15a that includes a plurality of permanent magnets disposed at a predetermined distance in the X-axis direction is fixed (the illustration is omitted in FIG. 4). Magnetic unit 15a configures, together with coil unit 29a of X mover 29, an X linear motor by the Lorentz force drive method that drives X coarse movement stage 23X in the X-axis direction. Further, on each of the both side surfaces and the upper surface of each guide section 15, an X guide 15b arranged extending in the X-axis direction is fixed (the illustration is omitted in FIG. 4). Meanwhile, a plurality of slide sections 29b each having an inverse U-like sectional shape, which include a plurality of bearings (not illustrated), and each mechanically engage with each X guide 15b in a slideable state with respect to each X guide 15b, are placed on each X mover 29.

On the lower surface of the center portion, in the longitudinal direction, of each of a pair of Y beam members 25, a slide section 27 is fixed that has, at its lower end, a member having a U-like sectional shape that mechanically engages with an X guide 17 fixed to base frame 14B in a slideable state with respect to X guide 17. On the upper surface of each of a pair of Y beam members 25, a Y guide 28 arranged extending in the Y-axis direction is fixed.

Y coarse movement stage 23Y is composed of a plate-shaped (or box-shaped) member having a roughly square shape in a planar view, and as shown in FIG. 2, has an opening section 23Ya in the center portion that penetrates in the Z-axis direction. At four corner portions on the lower surface of Y coarse movement stage 23Y, a slide section 30 having an inverse U-like sectional shape is fixed, which includes a plurality of bearings (not illustrated) and is mechanically engaged on Y guide 28 fixed on Y beam member 25 described above in a slideable state with respect to Y guide 28 (see FIG. 4). Incidentally, although the illustration is omitted in the drawings, on the upper surface of each Y beam member 25, for example, a magnetic unit including a plurality of magnets is arranged extending parallel to Y guide 28, and on the lower surface of Y coarse movement 23Y, a coil unit including a plurality of coils is placed. The magnetic unit on each Y beam member 25 and the coil unit of Y coarse movement stage 23Y, which corresponds to the magnetic unit, configure a Y linear motor by the Lorentz force drive method that drives Y coarse movement stage 23Y in the Y-axis direction. Incidentally, the drive method (the actuator) of the X coarse movement stage and the Y coarse movement stage is not limited to the liner motor but can be a ball screw drive or a belt drive.

Figure 3:
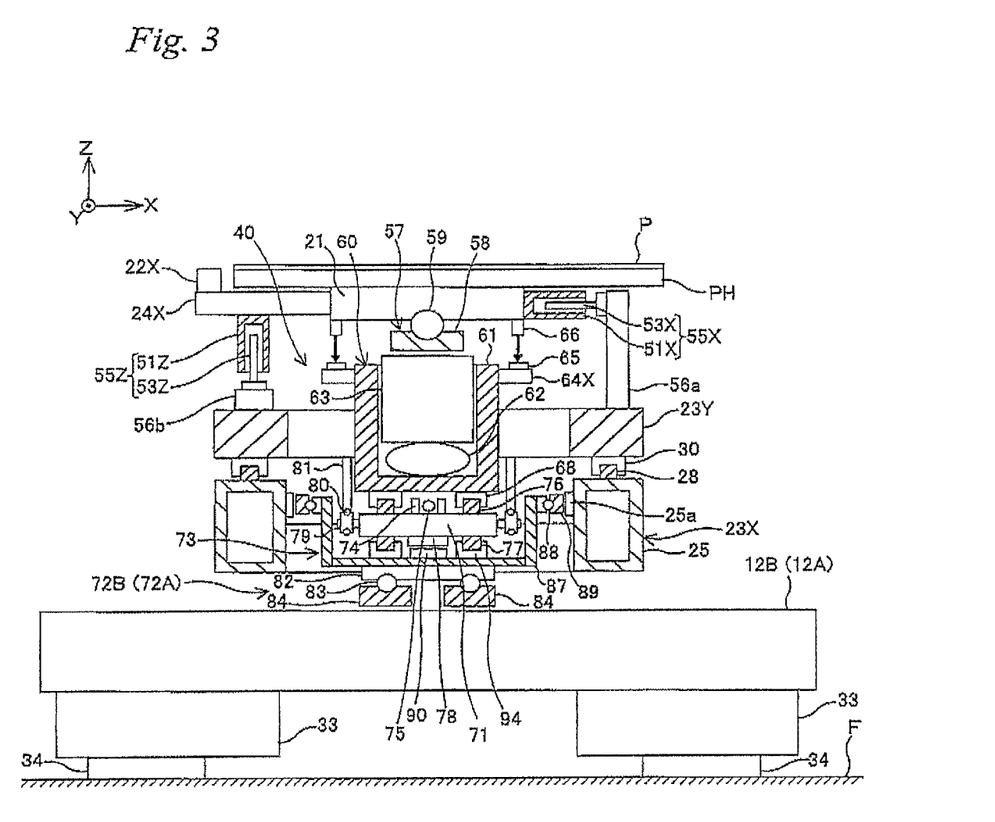
FIG. 3 is a side view (partial cross-sectional view) of the substrate stage equipped in the exposure apparatus when viewed from a Y-axis direction.

As shown in FIG. 2, to the end on the +Y side of the upper surface of Y coarse movement stage 23Y, a plurality, e.g., three of Y stators 53Y placed at a predetermined distance in the X-axis direction (overlapping in a direction in the depth of the drawing in FIG. 2) are fixed via a columnar support member 56a arranged extending in the Z-axis direction. Further, as shown in FIG. 3, to the end on the +X side of the upper surface of Y coarse movement stage 23Y, a plurality, e.g., three of X stators 53X placed at a predetermined distance in the Y-axis direction (overlapping in a direction in the depth of the drawing in FIG. 3) are fixed via columnar support member 56a arranged extending in the Z-axis direction. Y stators 53Y and X stators 53X each have a coil unit including a plurality of coils (the illustration is omitted).

Further, as shown in FIGS. 2 and 3, at the four corner portions on the upper surface of Y coarse movement stage 23Y, a Z stator 53Z is fixed via a support member 56b. Incidentally, in order to prevent intricacy of the drawings, of the four Z stators 53Z, only Z stator 53Z on the −Y side and the +X side is shown in FIG. 2, only Z stator 53Z on the −X side and the −Y side is shown in FIG. 3, and the illustration of the other two Z stators is omitted. Z stators 53Z each have a coil unit including a plurality of coils (the illustration is omitted).

Fine movement stage 21 is made up of a plate-shaped (or box-shaped) member having a roughly square shape in a planar view, and holds substrate P on its upper surface via a substrate holder PH. Substrate holder PH has, for example, at least a part of a vacuum suction mechanism (or an electrostatic adsorption mechanism) that is not illustrated, and holds substrate P by suction on its upper surface.

As shown in FIGS. 2 and 3, on the side surface on the −Y side and on the side surface on the −X side of fine movement stage 21, movable mirrors (bar mirrors) 22Y and 22X are fixed via fixed members 24Y and 24X, respectively. The surface on the −X side of movable mirror 22X and the surface on the −Y side of movable mirror 22Y are respectively mirror-finished to serve as the reflection surfaces. Positional information of fine movement stage 21 with the XY plane is constantly detected at a resolution of, for example, 0.5 to 1 nm, by a laser interferometer system 92 (see FIG. 1) that irradiates movable mirrors 22X and 22Y with measurement beams. Incidentally, while laser interferometer system 92 is actually equipped with an X laser interferometer and a Y laser interferometer that correspond to X movable mirror 22X and Y movable mirror 22Y respectively, only the Y laser interferometer is representatively illustrated in FIG. 1.

Further, as shown in FIG. 2, on the side surface on the +Y side of fine movement stage 21, a plurality, e.g., three of Y movers 51Y each having a U-like sectional shape placed at a predetermined distance in the X-axis direction are fixed. Further, as shown in FIG. 3, on the side surface on the +X side of fine movement stage 21, a plurality, e.g., three of X movers 51X each having a U-like sectional shape placed at a predetermined distance in the Y-axis direction are fixed. Each of Y movers 51Y and X movers 51X has a magnetic unit including a plurality of magnets (the illustration is omitted) on a pair of opposed surfaces that are opposed to each other. The three Y movers 51Y configure three Y-axis voice coil motors 55Y (hereinafter, shortly referred to as Y-axis VCMs 55Y) by the Lorentz force drive method, together with the three Y stators 53Y, respectively, and the three X movers 51X configure three X-axis voice coil motors 55X (hereinafter, shortly referred to as X-axis VCMs 55X) by the Lorentz force drive method, together with the three X stators 53X, respectively. The main controller, which is not illustrated, drives fine movement stage 21 in the θz direction, by causing drive forces (thrusts) generated by X-axis VCMs 55X (or Y-axis VCMs 55Y), for example, on both ends from among the three X-axis VCMs 55X (or Y-axis VCMs 55Y) to be different.

Further, at four corner portions on the lower surface of fine movement stage 21, a Z mover 51Z having an inverse U-like sectional shape is fixed. Incidentally, in order to prevent intricacy of the drawings, of the four Z movers 51Z, only Z mover 51Z on the −Y side and the +X side is shown in FIG. 2, and only Z mover 51Z on the −X side and the −Y side is shown in FIG. 3, and the illustration of the other two Z movers is omitted. Further, while Z movers 51Z are connected to fixed members 24X and 24Y in FIGS. 2 and 3 for the sake of convenience of the illustration, Z movers 51Z are actually fixed to the lower surface of fine movement stage 21. Z movers 51Z are each equipped with a magnetic unit including a plurality of magnets (the illustration is omitted) on a pair of opposed surfaces that are opposed to each other. The four Z movers 51Z configure four Z-axis voice coil motors 55Z (hereinafter, shortly referred to as Z-axis VCMs 55Z) by the Lorentz force drive method, together with the four Z stators 53Z, respectively. The main controller, which is not illustrated, drives (vertically moves) fine movement stage 21 in the Z-axis direction by controlling the respective thrusts of the four Z-axis VCMs 55Z to be the same. Further, the main controller drives fine movement stage 21 in the θx direction and the θy direction by controlling the thrusts of the respective Z-axis VCMs 55Z to be different. Incidentally, while the four Z-axis VCMs are placed corresponding to the four corner portions of the fine movement stage in the embodiment, this is not intended to be limiting, but Z-axis VCM 55Z should generate the thrusts in the Z-axis direction from at least three non-collinear points.

With the configuration as described above, substrate stage PST is capable of driving (coarsely moving) substrate P with a long stroke in the two axes (i.e. X-axis and Y-axis) directions, and also is capable of driving (finely moving) substrate P with a minute stroke in directions of six degrees of freedom (the X-axis, Y-axis and Z-axis directions and the θx, θy and θz directions). Incidentally, while each of the X-axis VCMs, the Y-axis VCMs and the Z-axis VCMs in the embodiment is the voice coil motor by a moving magnet method in which the mover has the magnetic unit, this is not intended to be limiting, and each of the X-axis VCMs, the Y-axis VCMs and the Z-axis VCMs can be a voice coil motor by a moving coil method in which a mover has a coil unit. Further, the drive method can be a drive method other than the Lorentz force drive method. Similarly, each of the linear motors equipped in exposure apparatus 10 can be based on either of the moving magnet method or the moving coil method, and the drive method of each of the linear motors is not limited to the Lorentz force drive method, but can be another drive method such as a variable magnetoresistance method.

Empty-weight cancelling device 40 is a member that supports the empty weight of a system including fine movement stage 21 (to be more specific, a system composed of fine movement stage 21, substrate holder PH, movable mirrors 22X and 22Y, fixed members 24X and 24Y, and the like), and as shown in FIG. 2, empty-weight cancelling device 40 is equipped with a device main body 60 that moves in conjunction with fine movement stage 21 and a follow and support device 70 that supports device main body 60 above surface plates 12A and 12B and moves following device main body 60.

Device main body 60 is made up of a columnar member arranged extending in the Z-axis direction, and is inserted in through-hole 23Ya formed at Y coarse movement stage 23Y.

Device main body 60 includes a housing 61, an air spring 62 and a slide section 63. Device main body 60 is also referred to as a central pillar.

Housing 61 is made up of a cylinder-like member having a bottom. A pair of Y arm-shaped members 64Y extending in the +Y direction and the −Y direction respectively as shown in FIG. 2 and a pair of X arm-shaped members 64X extending in the +X direction and the −X direction respectively as shown in FIG. 3 are fixed to the outer side of the upper end of the peripheral wall surface of housing 61 (hereinafter, generically, the four arm-shaped members are simply referred to as arm-shaped members 64). At the tip of each of the four arm-shaped members 64, a probe section 65 is placed. Meanwhile, on the lower surface of fine movement stage 21, a target section 66 is placed so as to correspond to each of probe sections 65 described above. In the embodiment, capacitance sensors (hereinafter, referred to as Z sensors) that are capable of measuring a distance between probe sections 65 and target sections 66, i.e. the Z-position of fine movement stage 21 are configured including these probe sections 65 and target sections 66. The outputs of the Z sensors are supplied to the main controller that is not illustrated. The main controller controls the position of fine movement stage 21 in the Z-axis direction and the tilt quantity of fine movement stage 21 in each of the θx direction and the θy direction, using the measurement results of the four Z sensors. Incidentally, the number of the Z sensors is not limited to four but can be, for example, three as far as the Z-position of fine movement stage 21 can be measured in at least three non-collinear positions. Further, the Z sensor is not limited to the capacitance sensor but can be a laser displacement gauge by a CCD method or the like. Further, the positional relation between the probe sections and the target sections that constitute the Z sensors can be opposite to the above-described positional relation.

As shown in FIG. 2, housing 61 is connected to Y coarse movement stage 23Y by a pair of flexures 67 placed on the +Y side and the −Y side of housing 61, respectively. Flexure 67 is equipped with a thin plate formed by, for example, steel, one end of which is connected to housing 61 and the other end of which is connected to Y coarse movement stage 23Y, via a ball joint. Accordingly, when Y coarse movement stage 23Y is driven in the Y-axis direction on X coarse movement stage 23X, by the Y linear motor described earlier (the illustration is omitted), housing 61 is towed by Y coarse movement stage 23Y because of the tensile force acting on the thin plate, and housing 61 moves integrally with Y coarse movement stage 23Y in the Y-axis direction (the +Y direction and the −Y direction). However, the position of housing 61 in the Z-axis direction and the θx, θy and θz directions is not restricted by Y coarse movement stage 23Y owing to the operation of the hinged joint of the ball joint. Further, flexures 67 connect device main body 60 and Y coarse movement stage 23Y within a plane that includes the gravity center position of device main body 60 in the Z-axis direction. Accordingly, when device main body 60 is driven in the Y-axis direction, the moment in the θx direction (around the X-axis) can be suppressed from acting on device main body 60, and device main body 60 can stably be driven in the Y-axis direction. Incidentally, to be exact, if the kinetic frictional force between slide sections 68 and 76, which are described later on, is strong, the position of the flexures should be shifted downward from the gravity center plane, taking the kinetic frictional force into consideration. Regarding the movement in the Y-axis direction, however, the moment can be received with a pair of the base pads (which spans a wider range in the Y-axis direction compared with that in the X-axis direction), and therefore device main body 60 can be driven in a relatively stable manner even if there is the influence of the frictional force.

Air spring 62 is housed in the lowermost section within housing 61. A gas (e.g. air) is supplied from a gas supplying device, which is not illustrated, to air spring 62, and thereby the inside of air spring 62 is set to be a positive pressure space whose pressure is higher compared with the outside. Device main body 60 reduces the burden on Z-axis VCMs 55Z by air spring 62 absorbing (cancelling) the empty weight of fine movement stage 21 and the like, in a state of supporting fine movement stage 21. Further, air spring 62 also functions as a Z-axis air actuator that drives fine movement stage 21 (i.e. substrate P) in the Z-axis direction with a long stroke by the change of its inner pressure. Instead of air spring 62, a damper also serving as an actuator (e.g. a shock absorber corresponds thereto) that can absorb (cancel) the empty weight of fine movement stage 21 in a state of supporting fine movement stage 21 and also drives fine movement stage 21 in the Z-axis direction can be used. In this case, a spring by another method such as a bellows method or a hydraulic method can be used.

Slide section 63 is a cylinder-like member housed inside housing 61. On the inner side of the peripheral wall of housing 61, a plurality of air pads that are not illustrated are attached and form a guide used when slide section 63 moves in the Z-axis direction. On the upper surface of slide section 63, a plurality of air pads, which are not illustrated, are placed and support a leveling device 57 by levitation.

Leveling device 57 includes a bearing section 58 and a ball 59. Bearing section 58 is composed of a tabular member placed parallel to the XY plane, and its lower surface is opposed to the air pads (the illustration is omitted) placed on the upper surface of slide section 63. On the upper surface of bearing section 58, a concave section having a hemispherical shape is formed and the lower portion of ball 59 is slideably fitted into the concave section. Further, in the center of the lower surface of fine movement stage 21 as well, a concave section having a hemispherical shape is similarly formed, and the upper portion of ball 59 is slideably fitted into the concave section. Incidentally, ball 59 can be fixed to fine movement stage 21. Accordingly, fine movement stage 21 is capable of freely moving (oscillating) in the tilt directions (the θx direction and the θy direction) with respect to slide section 63. Incidentally, device main body 60 (including flexures 67) in the embodiment is configured similar to the empty-weight cancelling mechanism that is disclosed in, for example, PCT International Publication No. 2008/129762 (the corresponding U.S. Patent Application Publication No. 2010/0018950) and the like. Further, instead of leveling device 57 described above, a mechanism can also be used, which allows the tilt of the fine movement stage by supporting a triangular-pyramid-shaped member with a plurality (e.g. three) of air pads, as disclosed in PCT International Publication No. 2008/129762 described above.

As shown in FIG. 2, follow and support device 70 is formed into a tabular shape with the Y-axis direction (i.e. the step direction) serving as its longitudinal direction, and includes a step board 71 that supports device main body 60 from below, a pair of base pads 72A and 72B that support step board 71 from below, and a gravity-center driving device 73 placed between a pair of base pads 72A and 72B.

As shown in FIG. 4, step board 71 is placed in a rectangular opening section that is formed by a pair of Y beam members 25 and a pair of connecting members 26 of X coarse movement stage 23X. The size of step board 71 in the longitudinal direction is set shorter than the distance between a pair of connecting members 26 (e.g. set to the length around three quarters of the distance). Further, as shown in FIG. 2, step board 71 is placed astride surface plates 12A and 12B via base pads 72A and 72B.

As shown in FIG. 4, a stopper 74 is fixed to both ends in the Y-axis direction of the upper surface of step board 71, respectively. Each stopper 74 is made up of a pair of protrusion sections placed at a predetermined distance in the X-axis direction, and between the pair of the protrusion sections, a guide rope 75 stretched along the Y-axis direction is inserted via a minute gap (see FIG. 3). Guide rope 75 is stretched between the upper surfaces of a pair of connecting members 26. Accordingly, rotation around the Z-axis (in the θz direction) of step board 71 is suppressed. Guide rope 75 is formed by, for example, a wire rope or the like.

On the upper surface of step board 71, a pair of Y guides 76 are arranged extending in the Y-axis direction, on the +X side and the −X side with guide rope 75 in between. As shown in FIGS. 3 and 4, device main body 60 has a plurality (four in the embodiment) of slide sections 68 each having an inverse U-like sectional shape that mechanically engage with a pair of Y guides 76 in a slideable state with respect to a pair of Y guides 76, at four corner portions on the lower surface of housing 61, and device main body 60 relatively moves freely in the Y-axis direction on step board 71 and moves integrally with step board 71 in the X-axis direction. Further, as shown in FIG. 3, on the lower surface of step board 71, a pair of Y guides 77 are arranged extending in the Y-axis direction so as to correspond to a pair of Y guides 76 respectively. Furthermore, in the center portion of the lower surface of step board 71, a magnetic unit 78 including a plurality of permanent magnets, which are not illustrated, is arranged extending in the Y-axis direction.

As shown in FIG. 4, on each of the side surfaces on the +X side and the −X side of step board 71, a pair of pulleys 79a and 79b that are freely rotatable around axes parallel to the X-axis direction are attached. Drive ropes 80a and 80b, each of which is formed by, for example, a wire rope or the like, are wrapped around a pair of pulleys 79a and 79b, respectively. As shown in FIG. 2, one end of drive rope 80a wrapped around pulley 79a on the +Y side is fixed to connecting member 26 on the +Y side of X coarse movement stage 23X, and the other end is fixed to Y coarse movement stage 23Y via a support member 81a fixed to the end on the +Y side of the lower surface of Y coarse movement stage 23Y. Meanwhile, one end of drive rope 80b wrapped around pulley 79b on the −Y side is fixed to connecting member 26 on the −Y side of X coarse movement stage 23X, and the other end is fixed to Y coarse movement stage 23Y via a support member 81b fixed to the end on the −Y side of the lower surface of Y coarse movement stage 23Y. As the drive rope, while a member that has flexibility and has little change in its longitudinal direction because of a tensile force is desirable, its shape is not limited to a rope but can be formed into, for example, a belt shape.

Accordingly, when Y coarse movement stage 23Y is driven by the Y linear motor described previously (the illustration is omitted) in the Y-axis direction on X coarse movement stage 23X, step board 71 is towed by Y coarse movement stage 23Y because of the tensile force acting on drive rope 80a or drive rope 80b, and moves following Y coarse movement stage 23Y in the Y-axis direction. However, the movement distance of step board 71 in the Y-axis direction is half (one-half) the movement distance of Y coarse movement stage 23Y in the Y-axis direction and the drive speed is also half the drive speed of Y coarse movement stage 23Y, because pulleys 79a and 79b function as moving pulleys. Incidentally, if the step board can be driven so as to follow the Y coarse movement stage at around a half speed, then a mechanism to drive the step board is not limited to the one described above, but for example, an actuator such as a liner motor or a mechanism including a feed screw or the like can also be used.

As shown in FIG. 2, a pair of base pads 72A and 72B are substantially the same members except that base pad 72A is placed on surface plate 12A and base pad 72B is placed on surface plate 12B. A set of base pads 72A and 72B are each equipped with a base section 82 formed into, for example, a tabular shape having an octagonal shape in a planar view (see FIG. 5) and a plurality, e.g., three of air pads 84 connected to the lower surface of base section 82 via ball joints 83. Air pads 84 form a clearance of, for example, around several μm between air pads 84 and the upper surface of surface plate 12A (or 12B) by blowing out the pressurized gas to the upper surface of surface plate 12A (or 12B). More specifically, air pads 84 function as static gas bearings that cause base section 82 to levitate above surface plate 12A (or 12B) by the static pressure of the gas. Incidentally, the number of air pads 84 is not limited to three, but can be, for example, two if the two air pads are spaced apart in the X-axis direction. In the embodiment, since a set of base pads 72A and 72B are placed apart in the Y-axis direction, step board 71 can stably be supported even with the two air pads. Although base pads 72A and 72B may contact with surface plate 12A (or surface plate 12B) depending on, for example, the required specifications of an exposure apparatus, a configuration in which base pads 72A and 72B are in noncontact with the surface plate using air pads 84 is employed, as an example, in the present embodiment so as to prevent the upper surface of surface plate 12A (or 12B) from being damaged owing to a frictional force, because exposure apparatus 10 of the embodiment is the apparatus for manufacturing large flat-panel displays.

Figure 5:
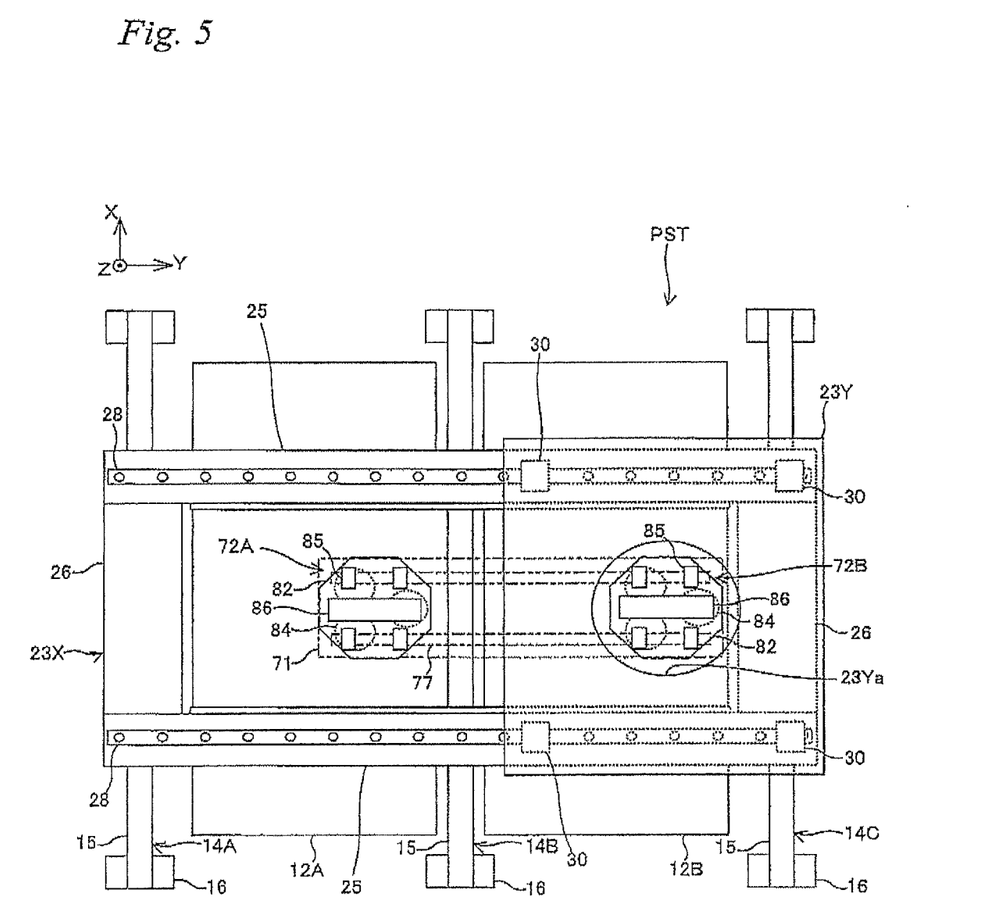
FIG. 5 is a plan view (No. 2) showing the substrate stage with partial omission.

As shown in FIG. 5, on the upper surface of base section 82, a plurality, e.g., four of slide sections 85 each having a U-like sectional shape are fixed that mechanically engage with a pair of Y guides 77 fixed to the lower surface of step board 71, in a slideable state with respect to a pair of Y guides 77. Accordingly, empty-weight cancelling device 40 (i.e. the system composed of device main body 60, step board 71 and a set of base pads 72A and 72B) is configured so as to integrally move in the X-axis direction.

Further, as shown in FIG. 5, on the upper surface of base section 82 of each of a pair of base pads 72A and 72B, one each of coil unit 86 including a plurality of coils (the illustration is omitted) is placed. Each coil unit 86 configures, together with magnetic unit 78 (see FIG. 3) placed on step board 71, a Y linear motor that drives base pads 72A and 72B in the Y-axis direction relative to step board 71. The electric currents supplied to the coils of coil unit 86 of one of the base pads, base pad 72A and the electric currents supplied to the coils of coil unit 86 of the other of the base pads, base pad 72B are independently controlled by the main controller that is not illustrated. Accordingly, it is possible to change the support positions of a pair of base pads 72A and 72B with respect to step board 71, independently from each other.

As shown in FIG. 3, gravity-center driving device 73 is equipped with a slide section 87 that is a member having a U-like sectional shape, and a pair of air pads 89 that are connected, via ball joints 88, to the tips (upper ends) of the opposed surfaces that are opposed to each other of slide section 87.

On slide section 87, a coil unit 90 including a plurality of coils is placed so as to be opposed to magnetic unit 78 fixed to the lower surface of step board 71. Coil unit 90 configures, together with magnetic unit 78, a Y linear motor that drives gravity-center driving device 73 in the Y-axis direction relative to step board 71. The electric currents supplied to the coils of coil unit 90 are controlled by the main controller that is not illustrated.

On the +X side and the −X side of coil unit 90, a slide section 94 having a U-like sectional shape is fixed that mechanically engages with Y guide 77 placed on the lower surface of step board 71, in a slideable state with respect to Y guide 77, so as to prevent gravity-center driving device 73 from falling because of the self weight. Accordingly, gravity-center driving device 73 and step board 71 integrally move in the X-axis direction.

By blowing out the pressurized gas to a pad guide 25a fixed to the inner side surface of each of a pair of Y beam members 25, each of a pair of air pads 89 forms a clearance of, for example, around several μm between air pad 89 and the inner side surface of Y beam member 25. Accordingly, while gravity-center driving device 73 is placed in a noncontact state with respect to a pair of Y beam members 25 and is movable in the Y-axis direction independently from Y beam members 25, gravity-center driving device 73 moves integrally with Y beam members 25 in the X-axis direction by the static pressure of the gas blown out from air pads 89.

In this case, the position in the Z-axis direction of the bearing surface (gas supplying surface) of each of a pair of air pads 89 roughly coincides with the position in the Z-axis direction of a gravity center position CG (see FIG. 2) of empty-weight cancelling device 40 (i.e. the system composed of device main body 60, step board 71 and a set of base pads 72A and 72B). Consequently, the drive force that operates when driving empty-weight cancelling device 40 in the X-axis direction (scan direction) acts on empty-weight cancelling device 40 in the X-axis direction within the plane including gravity center position CG. Accordingly, the moment in the θy direction (around the Y-axis) does not act on empty-weight cancelling device 40, which makes it possible to stably drive (drive at the gravity center) empty-weight cancelling device 40 in the X-axis direction.

Figure 6A:
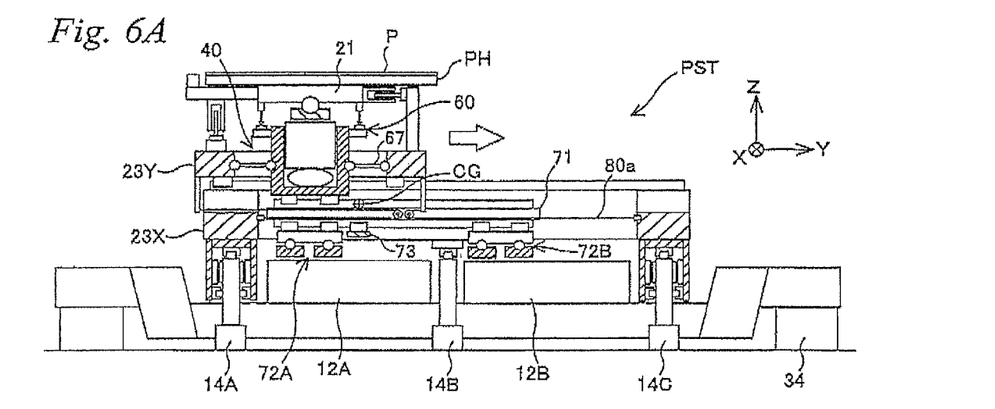
FIGS. 6A to 6C are views used to explain an operation of the substrate stage when a substrate is driven in a step direction (the Y-axis direction).
Figure 6B:
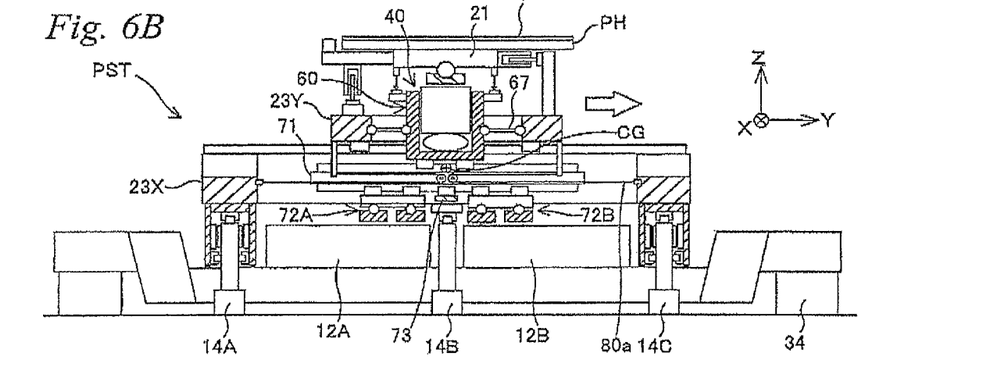
Figure 6C:
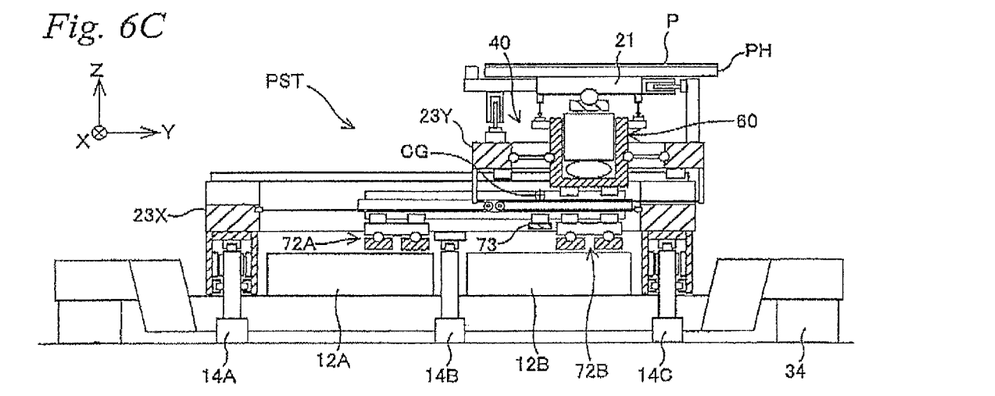

Furthermore, the main controller, which is not illustrated, controls the positions of a set of base pads 72A and 72B and gravity-center driving device 73 according to the position of device main body 60 in the Y-axis direction. In FIGS. 6A to 6C, the state is shown where base pads 72A and 72B and gravity-center driving device 73 are driven in accordance with the change in the position of device main body 60 in the Y-axis direction.

In FIG. 6A, Y coarse movement stage 23Y is located on the most −Y side in a range where Y coarse movement stage 23Y is movable in the Y-axis direction on X coarse movement stage 23X. In the state shown in FIG. 6A, device main body 60 is located above the vicinity of the end on the −Y side of surface plate 12A, and the main controller, which is not illustrated, causes one of the base pads, base pad 72A placed on surface plate 12A to position below device main body 60 (so as to overlap with device main body 60 in the Z-axis direction). Further, the main controller causes the other of the base pads, base pad 72B placed on surface plate 12B to position in the vicinity of the end on the −Y side of surface plate 12B. The size in the Y-axis direction of step board 71 is set such that the end on the −Y side of step board 71 is supported by base pad 72A and the end on the +Y side is supported by base pad 72B, respectively, in the state shown in FIG. 6A.

Next, for example, in the cases such as when a step operation is performed during exposure, if Y coarse movement stage 23Y is driven in the +Y direction on X coarse movement stage 23X, device main body 60 moves in conjunction with Y coarse movement stage 23Y in the +Y direction on step board 71, owing to the stiffness of the plate springs of flexures 67. Step board 71 is towed by drive rope 80a and moves in the +Y direction following device main body 60 (however, the movement stroke is almost half). Then, the main controller drives base pad 72A on surface plate 12A by a movement distance in accordance with a movement distance of Y coarse movement stage 23Y in the Y-axis direction. Accordingly, a state where base pad 72A is placed directly under device main body 60 is maintained at all times, while device main body 60 moves above surface plate 12A. In this manner, since the position of base pad 72A is controlled so as to constantly overlap with device main body 60 in the Z-axis direction, the bending stress owing to the uneven loading can be suppressed from acting on step board 71. Therefore, step board 71 can be reduced in thickness and weight.

Incidentally, as shown in FIG. 6B, when device main body 60 moves in the +Y direction in conjunction with Y coarse movement stage 23Y and is located above base frame 14B (between surface plate 12A and surface plate 12B), the main controller causes base pad 72A to stop in the vicinity of the end on the +Y side of surface plate 12A. In this state shown in FIG. 6B, since a set of base pads 72A and 72B are placed in proximity, the bending stress acting on the center portion of step board 71 can be the minimum.

When Y coarse movement stage 23Y is further driven from the state shown in FIG. 6B, in the +Y direction as shown in FIG. 6C, step board 71 also moves further in the +Y direction following device main body 60. Further, the main controller drives base pad 72B in accordance with a movement distance of Y coarse movement stage 23Y in the Y-axis direction such that base pad 72B is constantly placed directly under device main body 60, while device main body 60 moves above surface plate 12B. Incidentally, when Y coarse movement stage 23Y is driven in the −Y direction, which is opposite to the case shown in FIGS. 6A to 6C, step board 71 follows Y coarse movement stage 23Y and moves in the −Y direction by a movement distance that is half a movement distance of Y coarse movement stage 23Y, which is reverse to the above-described case, and the main controller controls base pad 72A or base pad 72B to be placed directly under device main body 60 at all times (except for the state shown in FIG. 6B).

On the other hand, for example, in the cases such as when an exposure operation (scan operation) is performed, when X coarse movement stage 23X is driven in the X-axis direction by the X liner motor, either one of a set of air pads 89 (see FIG. 3) of gravity-center driving device 73 is pressed against opposed Y beam guide 25. Accordingly, empty-weight cancelling device 40, which is composed of device main body 60, step board 71 and a set of base pads 72A and 72B that are mechanically connected to each other, moves integrally with X coarse movement stage 23X in the X-axis direction.

In this case, the main controller controls the position of gravity-center driving device 73 such that gravity-center driving device 73 follows the movement of gravity center position CG of empty-weight cancelling device 40, when device main body 60 moves in the Y-axis direction (which includes the case when device main body 60 also moves in the X-axis direction). Explaining more particularly using FIGS. 6A to 6C, gravity center position CG is located slightly on the −Y side from the center of step board 71 in the Y-axis direction, for example, in the state shown in FIG. 6A. The main controller causes gravity-center driving device 73 to be located at the position corresponding to gravity center position CG, as shown in FIG. 6A. When X coarse movement stage 23X is drive in the X-axis direction in this state, empty-weight cancelling device 40 is driven at the gravity center, in the X-axis direction via air pads 89 (see FIG. 3). Further, as shown in FIG. 6B, in a state where device main body 60 is located on the center of the step board in the Y-axis direction, gravity center position CG is located directly under device main body 60, and therefore, the main controller controls the position of gravity-center driving device 73 according to the location of gravity center position CG.

More specifically, as shown in FIGS. 6A to 6C, while the location of gravity center position CG of empty-weight cancelling device 40 changes in the Y-axis direction owing to the change in the relative positional relation between device main body 60, step board 71 and a set of base pads 72A and 72B, the main controller controls the position of gravity-center driving device 73 in the Y-axis direction according to the location change of gravity center position CG, and therefore, it is possible to make the drive force in the X-axis direction act constantly on gravity center position CG of empty-weight cancelling device 40. Accordingly, regardless of the relative positional relation between device main body 60, step board 71 and a set of base pads 72A and 72B, the moment in the θz direction (around the Z-axis) does not act on empty-weight cancelling device 40, and empty-weight cancelling device 40 can stably be driven at the gravity center, in the X-axis direction (which includes the case when empty-weight cancelling device 40 is driven in the X-axis direction and the Y-axis direction simultaneously). Incidentally, in order to calculate the drive distance of gravity-center driving device 73, it is preferable that the variation of gravity center position CG of empty-weight cancelling device 40, in accordance with the drive distance of fine movement stage 21 needed when substrate P is driven in the Y-axis direction, is obtained in advance by experiment (or simulation) or the like, and this data is converted into a table format (or a mathematical formula) and stored in a memory device, which is not illustrated, of the main controller. By referring to the table described above, the main controller can control the position of gravity-center driving device 73 with the drive distance in accordance with the position or the movement distance (i.e. the variation of gravity center position CG) of fine movement stage 21.

In liquid crystal exposure apparatus 10 configured as described above, under control of the main controller that is not illustrated, mask M is loaded onto mask stage MST by a mask loader that is not illustrated and substrate P is loaded onto substrate stage PST by a substrate loader that is not illustrated. After that, the main controller executes alignment measurement using an alignment detection system that is not illustrated, and after the alignment measurement is completed, an exposure operation by a step-and-scan method is performed. Since this exposure operation is similar to the exposure method by a step-and-scan method that has conventionally been performed, the description thereabout is omitted.

As described above, in liquid crystal exposure apparatus 10 in the embodiment, base pads 72A and 72B are respectively placed on the two surface plates 12A and 12B, and one step board 71 is supported by base pads 72A and 72B. Device main body 60 moves from above surface plate 12A to above surface plate 12B (or inversely) by moving on step board 71, and therefore, the boundary section between adjacent surface plate 12A and surface plate 12B that are placed separately does not function as a guide surface used when empty-weight cancelling device 40 moves in the Y-axis direction. Accordingly, although the two surface plates 12A and 12B are placed apart, empty-weight cancelling device 40 can be guided along the XY plane, which makes it possible to drive substrate P in the Y-axis direction in a stable manner.

Further, since the surface plates are configured of the two members, each of surface plates 12A and 12B can be reduced in size. Accordingly, the materials (e.g. stone materials) for the surface plates can be secured without difficulty, and also the surface plates can be processed and carried without difficulty. Further, since surfaces plates 12A and 12B can be placed apart, base frame 14B that supports X coarse movement stage 23X in a movable manner can be placed between the surface plates, which makes it possible to suppress the bending of the center portion of X coarse movement stage 23X in the longitudinal direction.

Incidentally, there are no problems with the transportation (carriage) even if the surface plate is longer in one direction (e.g. a direction corresponding to the X-axis in the embodiment above), and such increase in size in the one direction can be coped without difficulty by employing the apparatus configuration similar to the embodiment above. Further, in the case when the surface plate is longer in the one direction, three or more of the substrate stage mountings (33) can be placed, or the surface plate can be divided into a plurality of surface plates also in the one direction so as to be placed in the one direction.

Furthermore, since the configuration is employed in which device main body 60 of empty-weight cancelling device 40 moves on the step board that is a plate-shaped member placed so as to be bridged over the adjacent surface plates, the cost can be reduced compared to, for example, the case when a plurality of empty-weight cancelling devices are placed so as to correspond to a plurality (e.g. two in the embodiment above) of surface plates.

Further, since step board 71 moves in the Y-axis direction following device main body 60, the size and weight of step board 71 can be reduced. Further, since the configuration is employed in which step board 71 is towed by drive ropes 80*a* and 80*b*, the structure can be simplified compared to the case of providing an actuator or the like.

Further, since a plurality (two in the embodiment above) of surface plates 12A and 12B are placed at a predetermined distance in the step direction during exposure, or more specifically, since there is no stitching between the plurality of surface plates in the scan direction, the upper surfaces of surface plates 12A and 12B function as a single guide surface (similar to one surface plate having a single guide surface) during the scanning operation, and therefore substrate P can stably be driven in the scan direction.

Incidentally, in the embodiment above, while the two surface plates are arrayed at a predetermined distance in the step direction (Y-axis direction), this is not intended to be limiting, and for example, the three or more surface plates can be arranged. In this case, it is preferable that a base pad is placed on each of a plurality of surface plates and a step board that is longer in the Y-axis direction than that of the embodiment above is placed so as to be bridged over a plurality of base pads (i.e. in a state of lying astride a plurality of surface plates). Further, in the embodiment above, while the configuration in which the step board follows the device main body of the empty-weight cancelling device is employed, this is not intended to be limiting, and the step board can be fixed (in such a case, the size in the Y-axis direction needs to be longer than that of the embodiment above). Further, a plurality of surface plates can be arrayed at a predetermined distance in the scan direction (X-axis direction).

Further, in the embodiment above, while the configuration is employed in which the base pads move in the Y-axis direction following the device main body, this is not intended to be limiting, and the base pads can be configured not movable in the Y-axis direction (but movable in the X-axis direction) by forming the base pads in a larger size than the that of the embodiment. Further, in the embodiment above, while the configuration is employed in which the base pads are driven by the linear motor, a configuration can also be employed in which the base pads are towed by a wire rope or the like in a similar manner to the case of the step board. Further, while the configuration is employed in which the step board follows the device main body by being pulled by the wire rope, this is not intended to be limiting, and the step board can be driven by, for example, an actuator such as a liner motor. Furthermore, in the embodiment above, while the configuration is employed in which the empty-weight cancelling device moves in the X-axis direction by being pressed by the X coarse movement stage, this is not intended to be limiting, and the empty-weight cancelling device can be driven in the X-axis direction by an actuator such as a liner motor. Further, a plurality of base pads can be placed on one surface plate.

Further, the illumination light can be ultraviolet light, such as ArF excimer laser light (with a wavelength of 193 nm) and KrF excimer laser light (with a wavelength of 248 nm), or vacuum ultraviolet light such as $F_2$ laser light (with a wavelength of 157 nm). Further, as the illumination light, a harmonic wave, which is obtained by amplifying a single-wavelength laser beam in the infrared or visible range emitted by a DFB semiconductor laser or fiber laser with a fiber amplifier doped with, for example, erbium (or both erbium and ytterbium), and by converting the wavelength into ultraviolet light using a nonlinear optical crystal, can also be used. Further, solid state laser (with a wavelength of 355 nm, 266 nm) or the like can also be used.

Further, in the embodiment above, while the case has been described where projection optical system PL is a projection optical system by a multi-lens method that is equipped with a plurality of projection optical units, the number of the projection optical units is not limited thereto, but there should be one or more projection optical units. Further, projection optical system PL is not limited to the projection optical system by a multi-lens method, but can be, for example, a projection optical system that uses a large-size mirror of the Offner type.

Further, in the embodiment above, while the case has been described where the projection optical system whose projection magnification is an equal magnification is used as projection optical system PL, this not intended to be limiting, and the projection optical system can be either of a reduction system or a magnifying system.

Incidentally, in the embodiment above, a light transmissive type mask is used, which is obtained by forming a predetermined light-shielding pattern (or a phase pattern or a light-attenuation pattern) on a light transmissive mask substrate. Instead of this mask, however, as disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed, for example, a variable shaped mask that uses a DMD (Digital Micromirror Device) that is a type of a non-emission type image display element (which is also called a spatial light modulator) can also be used.

Incidentally, it is especially effective to apply the exposure apparatus of the present invention as in the embodiment above or the like to an exposure apparatus that exposes a substrate with a size (which includes at least one of an outer diameter, a diagonal line and a side) not less than 500 mm, for example, a large substrate for a flat-panel display (FPD), such as a liquid crystal display element. This is because the present invention has been made to cope with the increase in size of substrates.

Further, in the embodiment above, while the case has been described where the present invention is applied to a projection exposure apparatus that performs scanning type exposure that is accompanied by a step-and-scan operation of the plate, this is not intended to be limiting, and the present invention can also be applied to an exposure apparatus by a proximity method that does not use any projection optical systems. Further, the present invention can also be applied to an exposure apparatus by a step-and-repeat method (a so-called stepper) or an exposure apparatus by a step-and-stitch method.

Further, the use of the exposure apparatus is not limited to the exposure apparatus for liquid crystal display elements in which a liquid crystal display element pattern is transferred onto a rectangular glass plate, but the present invention can also be widely applied, for example, to an exposure apparatus for manufacturing semiconductors, and an exposure apparatus for producing thin-film magnetic heads, micromachines, DNA chips, and the like. Further, the present invention can be applied not only to an exposure apparatus for producing microdevices such as semiconductor devices, but can also be applied to an exposure apparatus in which a circuit pattern is transferred onto a glass substrate, a silicon wafer or the like to produce a mask or a reticle used in a light exposure apparatus, an EUV exposure apparatus, an X-ray exposure apparatus, an electron-beam exposure apparatus, and the like. Incidentally, an object that is subject to exposure is not limited to a glass plate, but for example, can be another object such as a wafer, a ceramic substrate, a film member, or a mask blank. Further, the present invention can also be applied to an exposure apparatus such as a liquid immersion type exposure apparatus in which a space between a projection optical system and a wafer is filled with a liquid, which is disclosed in, for example, U.S. Patent Application Publication No. 2005/0259234 and the like, as an exposure apparatus to transfer a circuit pattern onto a silicon wafer or the like.

Further, as disclosed in, for example, PCT International Publication No. 2001/035168, the present invention can also be applied to an exposure apparatus (a lithography system) in which line-and-space patterns are formed on a wafer by forming interference fringes on the wafer.

Incidentally, the present invention can be applied not only to the exposure apparatus but also to, for example, an element manufacturing apparatus equipped with a functional liquid imparting device by an ink-jet method.

Incidentally, the above disclosures of all the publications, the PCT International Publications descriptions, and the U.S. Patent Application Publications descriptions, and the U.S. Patents descriptions that are cited in the description above and related to exposure apparatuses and the like are each incorporated herein by reference.

Device Manufacturing Method

A manufacturing method of a microdevice that uses exposure apparatus 10 of the embodiment above in a lithography process is described next. In exposure apparatus 10 of the embodiment above, a liquid crystal display element as a microdevice can be obtained by forming a predetermined pattern (such as a circuit pattern or an electrode pattern) on a plate (a glass substrate).

Pattern Forming Process

First of all, a so-called optical lithography process in which a pattern image is formed on a photosensitive substrate (such as a glass substrate coated with a resist) is executed using exposure apparatus 10 described above. In this optical lithography process, a predetermined pattern that includes many electrodes and the like is formed on the photosensitive substrate. After that, the exposed substrate undergoes the respective processes such as a development process, an etching process and a resist removing process, and thereby the predetermined pattern is formed on the substrate.

Color Filter Forming Process

Next, a color filter in which many sets of three dots corresponding to R (Red), G (Green) and B (blue) are disposed in a matrix shape, or a color filter in which a plurality of sets of filters of three stripes of R, G and B are disposed in horizontal scanning line directions is formed.

Cell Assembling Process

Next, a liquid crystal panel (a liquid crystal cell) is assembled using the substrate having the predetermined pattern obtained in the pattern forming process, the color filter obtained in the color filter forming process, and the like. For example, a liquid crystal panel (a liquid crystal cell) is manufacture by injecting liquid crystal between the substrate having the predetermined pattern obtained in the pattern forming process and the color filter obtained in the color filter forming process.

Module Assembling Process

After that, a liquid crystal display element is completed by attaching respective components such as an electric circuit that causes a display operation of the assembled liquid crystal panel (liquid crystal cell) to be performed, and a backlight.

In this case, since exposure of the plate is performed with high throughput and high precision using the exposure apparatus of the embodiment above in the pattern forming process, the productivity of liquid crystal display elements can be improved as a consequence.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes a substrate to an energy beam while scanning the substrate in a first direction, the apparatus comprising:
    a substrate holding member that holds the substrate;
    a first supporting member that supports the substrate holding member from below;
    a second supporting member that supports the first supporting member from below such that the first supporting member and the second supporting member are capable of moving relative to each other; and
    a driving system that moves the substrate holding member, the first supporting member and the second supporting member, the driving system including a first driving device and a second driving device, the first driving device moving the substrate holding member and the first supporting member in a direction along a predetermined axis, and the second driving device moving the second supporting member in the direction along the predetermined axis.

2. A movable body apparatus, comprising:
    a movable body that holds an object;
    a first supporting member that supports the movable body from below;
    a second supporting member that supports the first supporting member from below such that the first supporting member and the second supporting member are capable of moving relative to each other; and
    a driving system that moves the movable body, the first supporting member and the second supporting member, the driving system including a first driving device and a second driving device, the first driving device moving the movable body and the first supporting, member in a direction along, a predetermined axis, and the second driving device moving the second supporting member in the direction along the predetermined axis.

3. The exposure apparatus according to claim 1, wherein the driving system includes a third driving device which moves the substrate holding member relative to the first supporting member, wherein
    the first driving device moves the third driving device in the direction along the predetermined axis and moves the substrate holding member by moving the third driving device.

4. The exposure apparatus according to claim 3, wherein the driving system includes a connecting member with which the first supporting member and the third driving device are connected such that the first supporting member is movable relative to the third driving device, and
    the first driving device moves the third driving device in the direction along the predetermined axis and moves the first supporting member via the connecting member by moving the third driving device.

5. The exposure apparatus according to claim 4, wherein the first supporting member has a supporting surface to support the substrate holding member such that the substrate holding member is movable relative to the supporting surface, and
    the third driving device is arranged outside a space between the substrate holding member and the supporting surface.

6. The exposure apparatus according to claim 5, wherein the substrate holding member is supported by the supporting surface in a state where the substrate holding member is levitated above the supporting surface.

7. The exposure apparatus according to claim 3, wherein the first supporting member has a supporting surface to support the substrate holding member such that the substrate holding member is movable relative to the supporting surface, and
    the third driving device is arranged outside a space between the substrate holding member and the supporting surface.

8. The exposure apparatus according to claim 7, wherein the substrate holding member is supported by the supporting surface in a state where the substrate holding member is levitated above the supporting surface.

9. The exposure apparatus according to claim 1, wherein a size of the substrate is not less than 500 mm.

10. The movable body apparatus according to claim 2, wherein
    the driving system includes a third driving device which moves the movable body relative to the first supporting member, wherein
    the first driving device moves the third driving device in the direction along the predetermined axis and moves the movable body by moving the third driving device.

11. The movable body apparatus according to claim 10, wherein
    the driving system includes a connecting member with which the first supporting member and the third driving device are connected such that the first supporting member is movable relative to the third driving device, and
    the first driving device moves the third driving device in the direction along the predetermined axis and moves the first supporting member via the connecting member by moving the third driving device.

12. The movable body apparatus according to claim 11, wherein the first supporting member has a supporting surface to support the movable body such that the movable body is movable relative to the supporting surface, and the third driving device is arranged outside a space between the movable body and the supporting surface.

13. The movable body apparatus according to claim 12, wherein the movable body is supported by the supporting surface in a state where the movable body is levitated above the supporting surface.

14. The movable body apparatus according to claim 10, wherein the first supporting member has a supporting surface to support the movable body such that the movable body is movable relative to the supporting surface, and the third driving device is arranged outside a space between the movable body and the supporting surface.

15. The movable body apparatus according to claim 14, wherein the movable body is supported by the supporting surface in a state where the movable body is levitated above the supporting surface.

16. A device manufacturing method, comprising:

exposing a substrate using the exposure apparatus according to claim 1; and developing the substrate that has been exposed.

* * * * *